United States Patent [19]
Kannegundla et al.

[11] Patent Number: 5,237,422
[45] Date of Patent: Aug. 17, 1993

[54] HIGH SPEED CLOCK DRIVING CIRCUITRY FOR INTERLINE TRANSFER CCD IMAGERS

[75] Inventors: Ram Kannegundla, Rochester; Teh-Hsuang Lee, Webster, both of N.Y.

[73] Assignee: Eastman Kodak Company, Rochester, N.Y.

[21] Appl. No.: 744,738

[22] Filed: Aug. 14, 1991

[51] Int. Cl.⁵ .......................................... H04N 5/335
[52] U.S. Cl. ........................ 358/213.11; 358/213.15; 358/209
[58] Field of Search .................... 358/213.11, 213.22, 358/213.25, 213.26, 213.27, 213.18, 209, 213.15; 357/24 LR; 307/207, 246, 269, 480; 340/805, 811

[56]         References Cited
         U.S. PATENT DOCUMENTS

| | | | |
|---|---|---|---|
| 4,117,514 | 9/1978 | Terui et al. | 358/213 |
| 4,424,456 | 1/1984 | Shiraki et al. | 307/268 |
| 4,514,766 | 4/1985 | Koike et al. | 358/213 |
| 4,518,978 | 5/1985 | Takeshita | 357/24 |
| 4,602,289 | 7/1986 | Sekine | 358/213 |
| 4,638,361 | 1/1987 | Takeshita | 358/213 |
| 4,680,636 | 7/1987 | Ooi | 358/213.18 |
| 4,707,744 | 11/1987 | Kimata et al. | 358/213.26 |
| 4,716,317 | 12/1987 | Spierings | 307/520 |
| 4,742,395 | 5/1988 | Nagai et al. | 358/213.19 |
| 4,761,565 | 8/1988 | Kannegundla | 307/243 |
| 4,866,299 | 9/1989 | Kannegundla | 307/270 |
| 4,935,794 | 6/1990 | Miyatake | 357/24 |
| 5,047,660 | 9/1991 | Kannegundla et al. | 307/270 |

*Primary Examiner*—Michael T. Razavi
*Assistant Examiner*—Tuan V. Ho
*Attorney, Agent, or Firm*—Stephen C. Kaufman

[57]         ABSTRACT

Clock driving circuitry for a high speed interline transfer CCD imager generates complementary voltage waveforms, each of which shifts from a respective first voltage level to a respective second voltage level once for every line in a frame to empty each of the imager's vertical shift registers in succession and to a respective third voltage level once each frame to charge all of the photodiodes of the imager. In generating one of the complementary waveforms, a positive third voltage level is superimposed upon the waveform through at least one isolation device and a separate switch is provided to discharge the waveform back to the second voltage level. In generating the other of the complementary waveforms, the waveform is switched from the second voltage level to a negative third voltage level and then switched back from the negative third voltage level to the second voltage level. Filtering is provided to remove transients generated by switching the latter wave from the negative third voltage level back to the second voltage level.

23 Claims, 3 Drawing Sheets

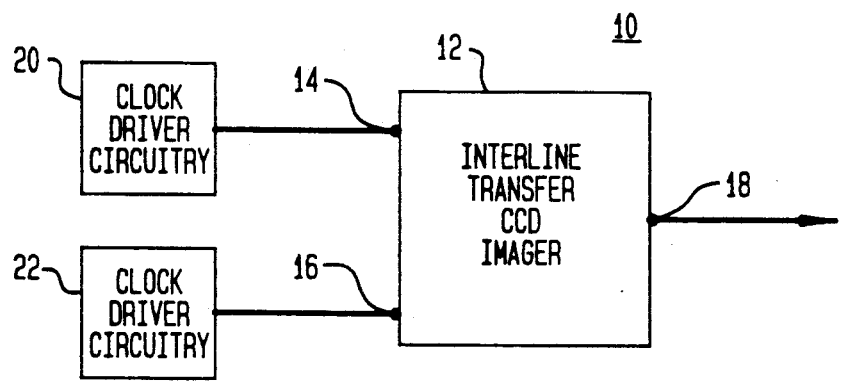
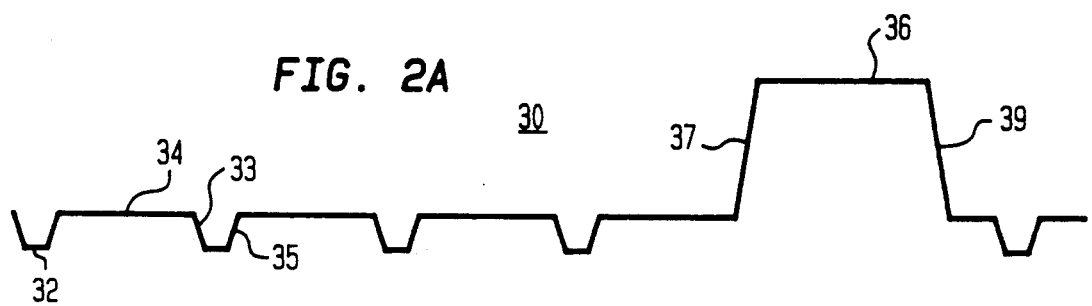
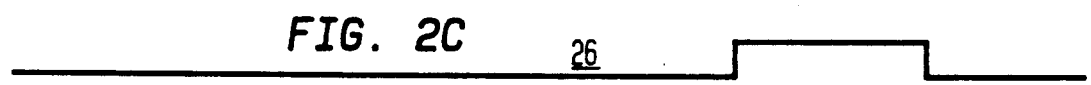
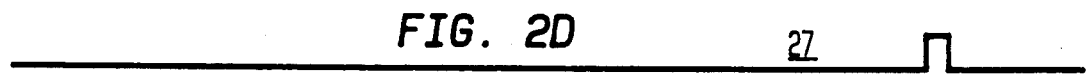
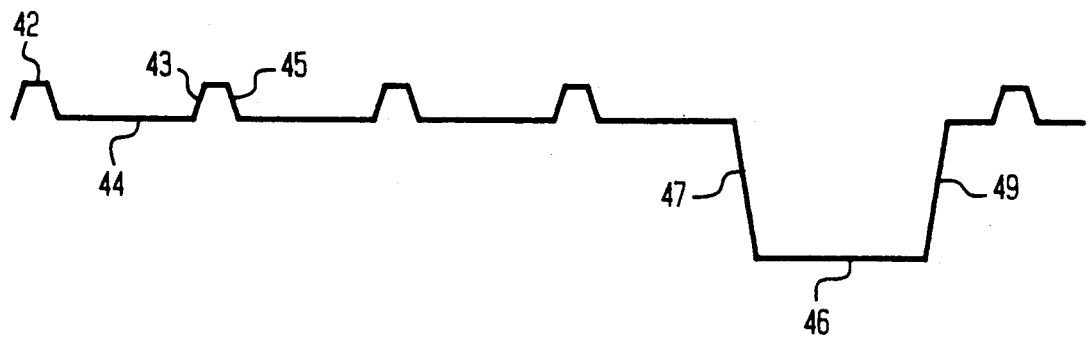

HIGH SPEED CLOCK DRIVING CIRCUITRY FOR INTERLINE TRANSFER CCD IMAGERS

FIELD OF THE INVENTION

This invention relates generally to clock driving circuitry for operating high load, high speed interline transfer CCD (Charge Coupled Device) imagers at high frame rates and, more particularly, to clock driving circuitry for such devices which also provides the relatively high positive and negative voltage levels and the large currents needed for emptying the charges contained in their photodiode arrays into the associated internal vertical shift registers.

BACKGROUND OF THE INVENTION

An interline transfer CCD imager contains separate photodiodes and vertical shift registers. The photodiodes are arranged in a frame comprising multiple horizontal lines each of which consists of a multiplicity of photodiodes, while each of the vertical shift registers is a repository into which the charges contained in a corresponding line of photodiodes are emptied. The shift registers constitute approximately half the total area of the imager and permit the photodiodes to be charged and emptied electrically, without any need for using a mechanical shutter. Electrically, the same gates within the interline transfer CCD imager control both the vertical shift registers and the photodiodes. Once the charges have been read out of each line of photodiodes into the corresponding vertical shift register, a sequence of vertical clock pulses is used to read the contents of each vertical shift register out of the interline transfer CCD imager in sequence. When all of the vertical shift registers have been cleared, a third level pulse (so called because its voltage level is appreciably greater in magnitude than the respective high and low levels of the remainder of the vertical clock pulse sequence) is applied to empty the photodiodes into their respective shift registers all over again.

The frame rate of a CCD imager may be increased by increasing the pixel clock frequency, by increasing the number of imager outputs, or by a combination of both. By way of example, an imager may be designed with 64 outputs and with a pixel frequency of 21 megahertz. The number of pixels per line per output of such an imager may be 17. To clock out 17 pixels at 21 megahertz, the time available for clocking out one line is only 810 nanoseconds. The horizontal retrace or line transfer time thus has to be held to 200 nanoseconds or less, the lower limit being the minimum time period during which the imager can still operate. A clock driver for such an arrangement needs to charge and discharge a 15,000 to 25,000 picofarad load with rise and fall times as short as 40 nanoseconds. The amount of leading edge current a clock driver of this type needs to supply is very large and is typically measured in amperes rather than in milliamperes.

The current $I_S$ through a switch connected to charge a capacitor from a constant current source, beginning at the instant the switch is closed, is given by the formula:

$$I_S = C dV_C/dt$$

where C is the capacitance of the capacitor and $dV_C/dt$ is the rate of change of the voltage across the capacitor with respect to time. To charge such a capacitor to 10 volts in 10 nanoseconds, the current $I_S$ is 0.1 ampere for a 100 picofarad capacitor, 1 ampere for a 1000 picofarad capacitor, 5 amperes for a 5000 picofarad capacitor, and 10 amperes for a 10,000 picofarad capacitor.

In the past, clock drivers have supplied low, high, and third levels to CCD imagers, using analog switches to set the several voltage levels and buffer amplifiers to supply the necessary current. Usually, buffer amplifiers can only supply up to 400 milliamperes maximum and have slow slew rates which are of the order of 15 volts per microsecond. Other clock drivers used in the past meet the new speed and current requirements for the low and high level voltages, but fail to meet positive and negative third level voltage requirements. Thus, the full set of speed, current, and voltage requirements for CCD imagers with which the present invention is concerned are not met with previously known drivers and a need for substantial improvement exists.

The present invention deals with the manner in which third level pulses are combined with the usual vertical clock pulses to drive high density interline transfer CCD imagers at very high frame rates with the large amounts of current required. Specifically, it deals with doing so using circuit components which are both relatively inexpensive and readily available commercially and which enable the necessary high speed, large current, and high voltage requirements to be met.

SUMMARY OF THE INVENTION

Clock driving circuitry according to the invention adds a positive third level, a negative third level, or a combination of both to the vertical clock output wave or waves used for emptying the succession of vertical shift registers provided internally within an interline transfer CCD imager. In one important form, clock driving circuitry according to the invention provides two complementary output waves to opposite CCD imager gates in order to drive the imager more effectively at high frame rates, adding a positive third level pulse to one and a negative third level pulse to the other. In the past, a third level voltage has typically been supplied only to one of the imager gates. With such arrangements, the imager substrate tends to bounce and additional time is required for charges to be transferred from the imager photodiodes to the vertical shift registers. The longer transfer time requires longer third level pulses and constitutes a limitation upon maximum attainable framing rates. This problem is overcome, according to an aspect of the invention, through the use of substantially complementary clock driving circuitry output waves, particularly with respect to the third level pulses used for emptying the photodiodes into the vertical shift registers. Imager substrate bounce induced by one clock driver output waveform is effectively cancelled by opposing bounce induced by the complementary clock driver waveform.

Viewed from one aspect, the invention is directed to clock driving circuitry which generates such complementary output waves. The clock driving circuitry comprises a first clock driver connected to supply a first of the two output waves to the imager, the first output wave shifting between first and second voltage levels to empty each of the imager's shift registers in succession, means including at least one isolation device for superimposing a third voltage level upon the first output wave to charge all of the photodiodes of the imager, the second voltage level of the first output wave being intermediate the first and third voltage levels of the first output wave, and first switching means connected to discharge the first output wave from its third voltage level to the second voltage level. Timing circuitry is also provided so that the first output wave shifts from its first voltage level to its second voltage level once for every line in each frame and to its third voltage level once per frame. The isolation device permits superimposing the third voltage level to take place but, by itself, would prevent discharge back to the second voltage level. The first switching means provides the necessary discharge path.

Viewed from this first mentioned aspect of the invention, the clock driving circuitry also comprises a second clock driver connected to supply a second output wave to the imager which is substantially complementary to the first output wave, the second output wave shifting between its own first and second voltage levels to empty each of the imager's shift registers in succession, and second switching means connected to shift the second output wave to a third voltage level to charge all of the photodiodes of the imager, the second voltage level of the second output wave being intermediate the first and third voltage levels of the second output wave. Additionally, third switching means is connected to shift the second output wave from its third voltage level back to its second voltage level and a filter is provided to remove transients from the second output wave introduced by the third switching means. The first and second output waves are thus substantially complementary to one another, even to the extent of the third level voltages, thereby permitting all of the imager photodiodes to be charged in minimum time without undesirable effects resulting from substrate bounce. Timing circuitry is provided so that the second output wave shifts from its first voltage level to its second voltage level once for every line in each frame and to its third voltage level once per frame. Because the direction of conductivity of otherwise suitable commercially available semiconductor devices prevents superimposing the third level voltage directly upon the second output wave as is done with the first output wave, it is switched instead. The filter is provided to remove transients introduced by that switching action.

Important sub-combinations according to the invention include the individual clock driving circuitry used for generating each of the respective complementary output waves.

One of these sub-combinations according to the invention takes the form of clock driving circuitry comprising a clock driver connected to supply an output wave to the imager, the output wave shifting between first and second voltage levels to empty each of the imager shift registers in succession, means including at least one isolation device for superimposing a third voltage level upon the output wave to charge all of the imager photodiodes, the second voltage level being intermediate the first and third voltage levels, and switching means connected to discharge the output wave from its third voltage level to its second voltage level. Timing circuitry is provided so that the output wave shifts from its first voltage level to its second voltage level once for every line in each frame and to its third voltage level once per frame.

Another sub-combination according to the invention takes the form of clock driving circuitry comprising a clock driver connected to supply an output wave to the imager, the output wave shifting between first and second voltage levels to empty each of the imager shift registers in succession, first switching means connected to shift the output wave to a third level to charge all of the imager photodiodes, the second voltage level being intermediate the first and third voltage levels, second switching means connected to shift the output wave from the third voltage level back to the second voltage level, and a filter connected to remove transients from the output wave introduced by the second switching means. Here too, timing circuitry is provided so that the output wave shifts from its first voltage level to its second voltage level once for every line in each frame and to its third voltage level once per frame.

The invention will be better understood from the following detailed description of a specific embodiment, taken in the light of the accompanying drawing and the appended claims.

BRIEF DESCRIPTION OF THE DRAWING

FIG. 1 is a block diagram showing the manner in which an interline transfer CCD imager is supplied with complementary clock driver output waves in accordance with the invention;

FIG. 2A is the waveform of a vertical clock driver output wave with a positive third level voltage;

FIGS. 2B, 2C, and 2D, are waveforms controlling various aspects of the generation of the waveform shown in FIG. 2A;

FIG. 3 is the waveform of a complementary vertical clock driver output wave with a negative third level voltage;

DETAILED DESCRIPTION

Figure 4:
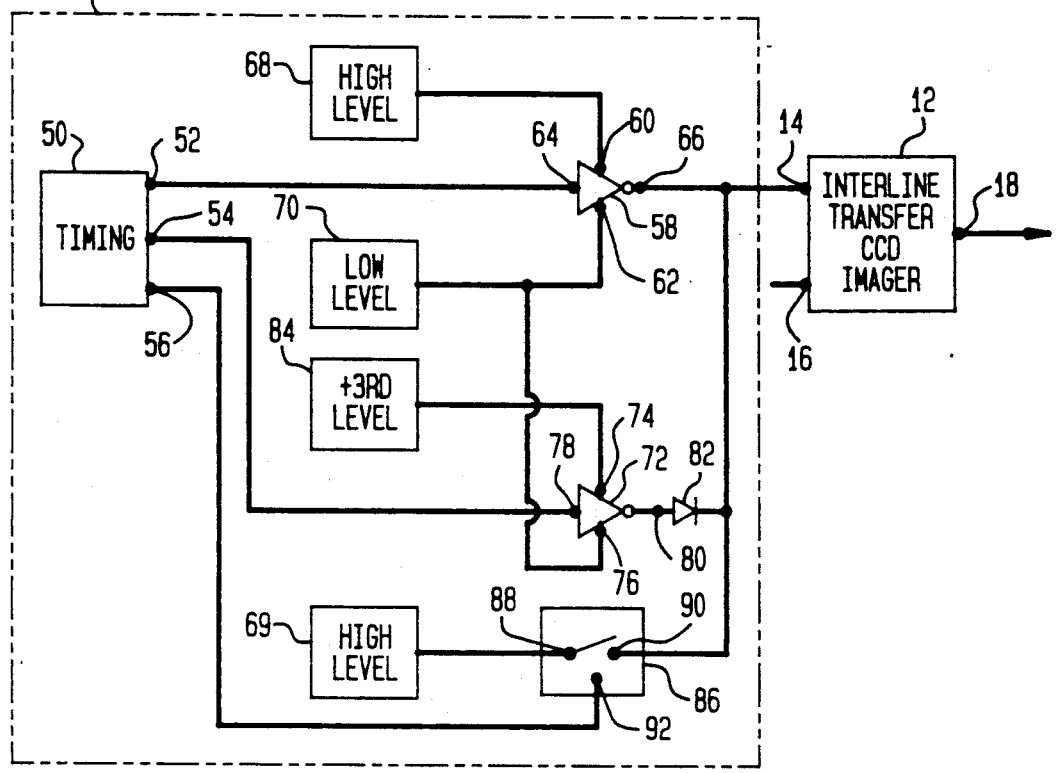
FIG. 4 is a block diagram illustrating clock driving circuitry according to the invention for generating a clock driver output wave like that shown in FIG. 2.

Referring to FIG. 1, there is shown a complete system 10 in accordance with the invention. System 10 comprises an interline transfer CCD imager 12 and clock driving circuitry 20 and 22. Imager 12 has two inputs (input terminals) 14 and 16 driving respective internal gates (not shown) with complementary vertical clock waveforms. Imager 12 has an output 18. Supplying inputs 14 and 16 are, respectively, clock driving circuitry 20 and clock driving circuitry 22. Together, clock driving circuitry 20 and clock driving circuitry 22 provide imager 12 with clock driving waveforms which are substantially complementary to one another.

As has already been explained, an interline transfer CCD imager differs from an ordinary frame transfer CCD imager in that it contains separate photodiodes and vertical shift registers. The photodiodes are arranged in a frame comprising multiple horizontal lines each of which consists of a large number of photodiodes. The charge on each photodiode represents the gray level of one of the pixels constituting the frame. Each of the shift registers stores the charges contained in a corresponding row of photodiodes. The shift registers make up approximately half the total area of an interline transfer CCD imager and permit the photodiodes to be charged and empties electrically. Unlike a frame transfer CCD imager, an interline transfer CCD imager requires no mechanical shutter for charging and discharging its photodiodes.

Electrically, the same gates within an interline transfer CCD imager control both the vertical shift registers and the photodiodes. Once the charges have been read out of each line of photodiodes into its corresponding vertical shift register, a sequence of vertical clock pulses is used to read the contents of each vertical shift register out of the imager in sequence. When all of the shift registers have been cleared, a third level pulse is applied to empty the charges contained in the photodiodes into their respective shift registers all over again. This latter pulse is called third level because its voltage level is substantially greater than the respective high and low voltage levels of the rest of the vertical clock sequence.

The complementary clock driving circuitry 20 and 22 of system 10 are particularly important in permitting the third level pulse applied to imager 12 to be as brief as possible. Without substantially complementary clock waveforms, third level pulses of longer duration would be required in order to permit imager substrate bounce to subside and achieving high frame rates for imager 12 would be more difficult. Imager substrate bounce induced by one third level pulse is effectively cancelled by the simultaneously occurring complementary third level pulse.

FIG. 2A illustrates a waveform 30 applied, for example, to input 14 of imager 12 in FIG. 1 from clock driving circuitry 20. As shown, waveform 30 has a first or low voltage level 32, a second or high voltage level 34, and a positive third voltage level 36. Actual voltages depend upon the specific application but, as a typical example, the first or low voltage level 32 may be minus four volts, the second or high voltage level 34 may be plus four volts, and the positive third voltage level 36 may be of the order of plus ten volts. Whatever the individual voltages, the second or high level is more positive than the first or low level and the positive third level is more positive than the second or high level.

Applied to an interline transfer CCD imager such as imager 12 in FIG. 1, each transition of waveform 30 from first level 32 to second level 34 causes the charges contained by a vertical shift register to be read out. These charges represent the pixels forming one entire line of a frame. After all vertical shift registers have been emptied in this manner, waveform 30 supplies a third level pulse represented by the transition from second level 34 to positive third level 36. The third level pulse terminates with a transition from third level 36 back down to second level 34 and the entire sequence begins again. In a typical example, the time duration of each transition 33 from high level to low level is 50 nanoseconds, the time duration of each transition 35 from low level back to high level is 50 nanoseconds, the time duration of each transition 37 from high level to third level is 200 nanoseconds, and the time duration of each transition 39 from third level back to high level is 200 nanoseconds. The slope of transition 35 is approximately 10 volts per 50 nanoseconds, assuming an imager load of from 15,000 to 25,000 picofarads.

FIGS. 2B, 2C, and 2D illustrate waveforms 25, 26, and 27, respectively, all of which are used in the generation of waveform 30 (and waveform 40 in FIG. 3) and will be referred to in more detail subsequently in the description of specific embodiments of the invention.

FIG. 3 illustrates a waveform 40 applied, for example, to input 16 of imager 12 in FIG. 1 from clock driving circuitry 22. As shown, waveform 40 is substantially complementary to waveform 30 in FIG. 2 and has a first or high voltage level 42, a second or low voltage level 44, and a negative third voltage level 46. In a typical example, the time duration of each transition 43 from low level to high level is 50 nanoseconds, the time duration of each transition 45 from high level back to low level is 50 nanoseconds, the time duration of each transition 47 from low level to negative third level is 200 nanoseconds, and the time duration of each transition 49 from negative third level back to low level is 200 nanoseconds. The slope of transition 45 is approximately 10 volts per 50 nanoseconds, assuming an imager load of from 15,000 to 25,000 picofarads. Actual voltages and slopes again depend upon the specific application but, as an example, the first or high voltage level 42 may be plus four volts, the second or low voltage level 44 may be minus four volts, and the negative third level voltage level 46 may be of the order of minus ten volts. Whatever the individual voltages, the second or low level is more negative than the first or high level and the negative third level is more negative than the second or low level.

Applied to an interline transfer CCD imager such as imager 12 in FIG. 1, each transition of waveform 40 from first level 42 to second level 44 causes the charges contained by a vertical shift register to be read out. These charges represent the pixels forming one entire line of a frame. After all vertical shift registers have been emptied in this manner, waveform 40 supplies a negative third level pulse represented by the transition from second level 44 to third level 46. The third level pulse terminates with a transition from third level 46 back down to second level 44 and the entire sequence begins again.

Referring to FIG. 4, there is shown within a dashed line rectangle an example of clock driving circuitry 20a according to the invention which is capable of supplying waveform 30 to input terminal 14 of interline transfer CCD imager 12. Circuitry 20a is a preferred embodiment of circuitry 20. As illustrated, clock driving circuitry 20a comprises a timing circuit 50 having respective output terminals 52, 54, and 56. Circuitry 20a also comprises a clock driver 58 which has a pair of high and low voltage terminals 60 and 62, an input control terminal 64, and an output terminal 66. Associated with clock driver 58 are a source 68 of a high level voltage, a second source 69 of the high level voltage, and a source 70 of a low level voltage. Additionally, a clock driver 72, generally similar to clock driver 58, has a pair of high and low voltage terminals 74 and 76, an input control terminal 78, and an output terminal 80. Still further components include an isolation device 82, poled in the direction toward imager 12, a source 84 of a positive third level voltage, a single pole single throw analog integrated circuit switch 86 having input and output terminals 88 and 90 and a control terminal 92. All voltage sources may be made adjustable in accordance with techniques well known in the art.

As shown, an output terminal 52 of timing circuit 50, which controls transitions of output wave 30 between low and high voltage levels and vice versa, is connected to input control terminal 64 of clock driver 60. The waveform appearing at terminal 52 is that shown in FIG. 2B as waveform 25. An output terminal 54 of timing circuit 50, which controls the transition from the high voltage level to the positive third voltage level, is connected to input control terminal 78 of clock driver 72. The waveform appearing at terminal 54 is that shown in FIG. 2C as waveform 26. An output terminal 56 of timing circuit 50, which controls the transition from the positive third voltage level back to the high voltage level, is connected to control terminal 92 of switch 86. The waveform appearing at terminal 56 is that shown in FIG. 2D as waveform 27. Output terminal 66 of clock driver 58 is connected to input terminal 14 of imager 12, as is terminal 90 of switch 86.

High level voltage source 68 is connected to high voltage terminal 60 of clock driver 58, while high level voltage source 69 is connected to terminal 88 of analog switch 86. Low level voltage source 70 is connected both to low voltage terminal 62 of clock driver 58 and to low voltage terminal 76 of clock driver 72. Positive third level voltage source 84 is connected to voltage terminal 74 of clock driver 72. Finally, output terminal 80 of clock driver 72 is connected through isolation device 82 to input terminal 14 of imager 12.

Clock driver 58 may generally take the form shown in FIG. 6, which will be described subsequently, and is essentially the same as the clock driver disclosed in detail in U.S. Pat. No. 4,761,565 to Ram Kannegundla, issued Aug. 2, 1988 (see, for example, FIG. 5 of the patent and the accompanying description). Because the driver 58 is short circuit protected, a plurality of individual drivers may be connected in parallel with one another, if desired, to provide the heavy currents needed for the instant application. Output terminal 66 of driver 58 in FIG. 4 is effectively switched by n-p-n transistors (shown in FIG. 6) internal to clock driver 58 between high level source 68 and low level source 70 under the control of timing circuit 50. Clock driver 72 may also generally take the form shown in FIG. 6, with output terminal 80 being effectively switched from high level source 68 to positive third level source 84 upon receipt of a timing pulse from timing circuit 50. Switch 86 is an analog single pole single throw integrated circuit switch which operates to switch its output terminal 90 to high level source 68 upon receipt of the proper timing pulse from timing circuit 50. Isolation device 82 is, as shown, a diode poled for easy current flow toward imager input terminal 14.

Clock driving circuitry 20 operates to superimpose the positive going third level voltage upon the remainder of the waveform. Isolation device 82 prevents clock driver 72 from pulling the output waveform down to the voltage of low level source 70 while clock driver 58 is supplying that of high level source 68. For this reason, clock driver 72 provides no discharge path for bringing the waveform from the positive third level voltage back down to the high level voltage upon termination of the third level pulse. Switch 86 serves that purpose by superimposing an equalizing pulse from high level source 68.

Figure 5:
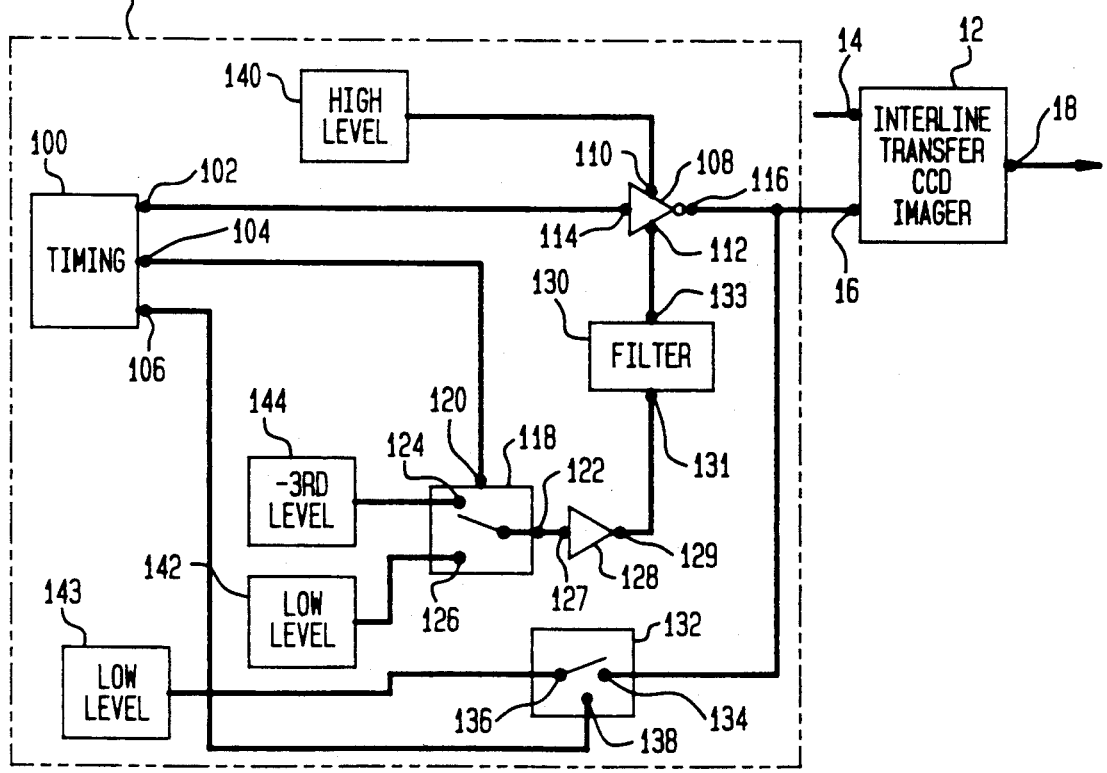
FIG. 5 is a block diagram illustrating clock driving circuitry according to the invention for generating a complementary clock driver output wave like that shown in FIG. 3.

FIG. 5 shows within a dashed line rectangle an example of clock driving circuitry 22a according to the invention. This circuitry 22a is capable of supplying waveform 40 to input terminal 16 of interline transfer CCD imager 12. Circuitry 22a is a preferred embodiment of circuitry 22 of FIG. 1. As illustrated, clock driving circuitry 22a comprises a timing circuit 100 having respective output terminals 102, 104, and 106. Timing circuit 100 may, by way of example, be the same as timing circuit 50 in FIG. 4. By way of further example, the same timing circuit may be used to supply both clock driving circuitry 20a and clock driving circuitry 22a at the same time. Circuitry 22a also comprises a clock driver 108 which has a pair of high and low voltage terminals 110 and 112, an input control terminal 114, and an output terminal 116. Circuitry 22a further comprises a single pole double throw analog integrated circuit switch 118 which has a control terminal 120, an output terminal 122, and a pair of voltage terminals 124 and 126. Additionally, there is an emitter follower transistor amplifier 128 having an input terminal 127 and an output terminal 129, a filter 130 having an input terminal 131 and an output terminal 133, and a single pole single throw analog switch 132 which has a pair of input and output terminals 134 and 136 and a control terminal 138. Finally, there is a source 140 of a high level voltage, a source 142 of a low level voltage, another source 143 of the low level voltage, and a source 144 of a negative third level voltage. All voltage sources may be made adjustable using techniques well known in the art.

As shown, output terminal 102 of timing circuit 100, which controls transitions of output wave 40 between low and high levels and vice versa, is connected to input terminal 114 of clock driver 108. The waveform appearing at terminal 102 is that shown in FIG. 2B as waveform 25. Output terminal 104 of timing circuit 100, which controls the transition from the low voltage level to the negative third voltage level, is connected to input control terminal 120 of switch 118. The waveform appearing at terminal 104 is that shown in FIG. 2C as waveform 26. Output terminal 106 of timing circuit 100, which controls the transition from the negative third voltage level back to the low voltage level, is connected to control terminal 138 of switch 132. The waveform appearing at terminal 106 is that shown in FIG. 2D as waveform 27.

Figure 7:
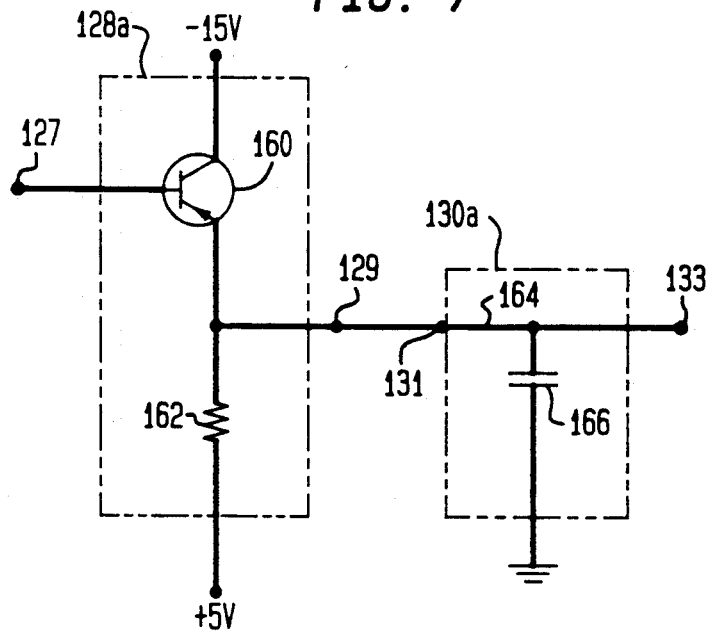
FIG. 7 shows the details of an emitter follower and a filter suitable for use in the clock driving circuitry illustrated in FIG. 5.

Emitter follower 128 and filter 130, which are both shown within separate dashed line rectangles in more detail in FIG. 7, are connected in sequence between from terminal 122 of switch 118 to voltage terminal 112 of clock driver 108. Terminal 134 of switch 132 is connected, along with output terminal 116 of clock driver 108, to input terminal 16 of imager 12. High level voltage source 140 is connected to voltage terminal 110 of clock driver 108, low level voltage source 142 is connected to terminal 126 of switch 118, negative third level voltage source 144 is connected to terminal 124 of switch 118, and low level voltage source 143 is connected to terminal 136 of switch 132.

Figure 6:
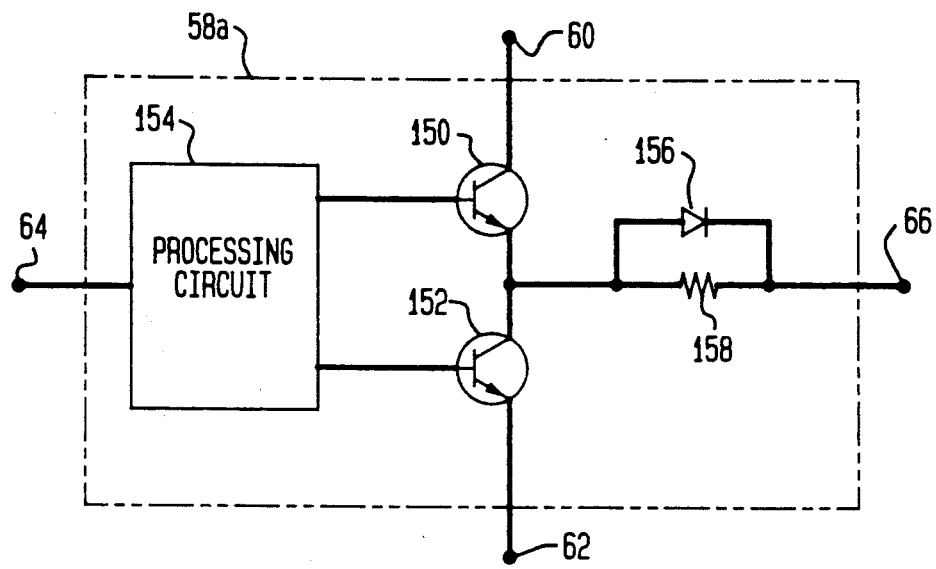
FIG. 6 shows details of a readily available clock driver suitable for use in the clock driving circuitry illustrated in FIGS. 4 and 5.

Clock driver 108 is generally similar to clock driver 60 in FIG. 4 and may also take the form shown in FIG. 6. Like clock driver 60, clock driver 108 is short circuit protected, permitting a plurality of individual drivers to be connected in parallel to provide needed current capacity. Output terminal 116 is effectively switched by n-p-n transistors (not shown in FIG. 5) internal to clock driver 108 between high level source 140 and low level source 142 under the control of timing circuit 100.

Because currently available clock drivers like clock driver 108 are based upon n-p-n transistor technology, a negative third level voltage cannot be readily superimposed upon the output waveform in the manner of FIG. 4. Instead, clock driving circuitry 22 relies upon switch 118, which is an analog integrated circuit single pole double throw switch. Switching the output waveform to the negative third level is difficult, however, because of load current requirements. Because switch 118 cannot accommodate large edge currents, it is followed by a buffer in the form of emitter follower amplifier 128 and by filter 130. Details of amplifier 128 and filter 130 are shown in FIG. 7 but, at this point, suffice it to say that amplifier 128 is a p-n-p transistor emitter follower and filter 130 consists essentially of a shunt capacitor having a capacitance of the order of ten times the load capacitance imposed by imager 12. When the time comes to terminate the negative going third level pulse, switch 134, which is an analog single pole single throw switch, returns the output waveform to the voltage of low level source 142. Filter 130 is needed to smooth out the resulting transient.

FIG. 6 illustrates a clock driver 58a (shown within a dashed line rectangle) like that shown in FIG. 5 of previously cited U.S. Pat. No. 4,761,565, which may be used, by itself or in parallel with others like it, as clock driver 58 in the embodiment of the present invention shown in FIG. 4. In the interest of clarity, the reference numerals associated with clock driver 58 in FIG. 4 of the present application are used wherever possible. In its basic form, clock driver 58a comprises a pair of substantially identical n-p-n transistors 150 and 152. The emitter-collector paths of the transistors are connected in series between a first voltage terminal 60 and a second voltage terminal 62, with the emitter of transistor 150 connected directly to the collector of transistor 152. Clock driver 58a has an input terminal 64 connected through a processing circuit 154 to the respective bases of transistors 105 and 152. A diode 156 has its anode coupled to the emitter of transistor 150 and the collector of transistor 152. The cathode of diode 156 is connected to an output terminal 66.

Circuits like clock driver 58a may also be used as clock driver 72 in FIG. 4 and as clock driver 108 in FIG. 5. In the former instance, input and output terminals 64 and 66 correspond to input and output terminals 78 and 80, respectively, and voltage terminals 60 and 62 correspond to voltage terminals 74 and 76, respectively. In the latter instance, input and output terminals 64 and 66 correspond to input and output terminals 114 and 116, respectively, and voltage terminals 60 and 62 correspond to voltage terminals 110 and 112, respectively.

FIG. 7 illustrates the combination of a conventional emitter follower transistor amplifier 128a and a simple filter 130a which may be used as amplifier 128 and filter 130 in FIG. 5. Both are entirely conventional. In the interest of clarity, reference numerals associated with amplifier 120 and filter 130 in FIG. 5 of the present application are used wherever possible. Amplifier 128a consists of an p-n-p transistor 160 having its collector connected to a negative fifteen volts and its emitter connected through a resistor 162 to a positive five volts. The base of transistor 160 is connected to an input terminal 127 and the emitter to an output terminal 129. Output terminal 129 is also connected to input terminal 131 of filter 130. Filter 130 simply consists of a through connection 164 from input terminal 131 to output terminal 133 and a capacitor 166 connected from through connection 164 to ground. As has already been explained, capacitor 166 has a capacitance substantially ten times that of the capacitive load imposed by the CCD imager.

It is to be understood that the embodiments of the invention which have been described are illustrative. Numerous other arrangements and modifications may be readily devised by those skilled in the art without departing from the spirit and scope of the invention.

What is claimed is:

1. Clock driving circuitry for an interline transfer CCD imager having separate photodiodes and shift registers, said photodiodes forming a frame comprising multiple lines, each of said lines comprising a multiplicity of photodiodes each, and each of said shift registers forming a repository for the charges contained in a corresponding line of photodiodes in said frame, said clock driving circuitry comprising:

a first clock driver connected to supply a first output wave to said imager, said first output wave shifting between first and second voltage levels to empty each of said shift registers in succession;

means including at least one isolation device for superimposing a third voltage level upon said first output wave to charge all of said photodiodes, said second voltage level of said first output wave being intermediate said first and third voltage levels of said first output wave;

first switching means connected to discharge said first output wave from the third voltage level of said first output wave to the second voltage level of said first output wave;

a second clock driver connected to supply a second output wave to said imager, said second output wave shifting between first and second voltage levels to empty each of said shift registers in succession;

second switching means connected to shift said second output wave to a third level to charge all of said photodiodes, said second voltage level of said second output wave being intermediate said first and third voltage levels of said second output wave;

third switching means connected to shift said second output wave from the third voltage level of said second output wave back to the second voltage level of said second output wave;

means to filter out transients from said second output wave introduced by said third switching means; and said first and second output waves are substantially complementary to one another.

2. The clock driving circuitry of claim 1 in which each of said first and second clock drivers includes at least one respective transistor switch having a respective output connected alternately between the said first and second voltage levels of its respective output wave.

3. The clock driving circuitry of claim 2 in which said transistor switches comprise n-p-n transistors.

4. The clock driving circuitry of claim 2 in which said superimposing means includes at least one transistor switch having an output connected alternately between the said first and third voltage levels of said first output wave.

5. The clock driving circuitry of claim 4 which includes an emitter follower transistor amplifier connected between said third switching means and said filtering means.

6. The clock driving circuitry of claim 5 in which said emitter follower transistor amplifier comprises a p-n-p transistor.

7. The clock driving circuitry of claim 5 in which each of said first and second clock drivers includes at least one respective transistor switch having a respective output connected alternately between the said first and second voltage levels of its respective output wave.

8. The clock driving circuitry of claim 7 in which said third switching means includes at least one analog switch having an output connected between the said first and third voltage levels of said second output wave.

9. The clock driving circuitry of claim 1 comprising at least one timing source connected to control said first and second clock drivers and shift each of the respective output waves from the first voltage level of the respective output wave to the second voltage level of the respective output wave once for every line in said frame, to control said superimposing means and shift said first output wave from the second voltage level of said first output wave to the third voltage level of said first output wave once per frame, to control said second switching means and shift said second output wave from the second voltage level of said second output wave to the third voltage level of said second output wave once per frame, to control said first switching means and discharge said first output wave from the third voltage level of said first output wave back to the second voltage level of said first output wave once per frame, and to control said third switching means and shift said second output wave from the third voltage level of said second output wave back to the second voltage level of said second output wave once per frame.

10. The clock driving circuitry of claim 1 in which said isolation device is a diode poled to conduct in the direction toward said imager.

11. Clock driving circuitry for an interline transfer CCD imager having separate photodiodes and shift registers, said photodiodes forming a frame comprising multiple lines, each of said lines comprising a multiplicity of photodiodes each, and each of said shift registers forming a repository for the charges contained in a corresponding line of photodiodes in said frame, said clock driving circuitry comprising:
a clock driver connected to supply an output wave to said imager, said output wave shifting between first and second voltage levels to empty each of said shift registers in succession;
means including at least one isolation device for superimposing a third voltage level upon said output wave to charge all of said photodiodes, said second voltage level being intermediate said first and third voltage levels; said isolation device being a diode poled to conduct in the direction toward said interline transfer CCD imager and
switching means connected to discharge said output wave from said third voltage level to said second voltage level.

12. The clock driving circuitry of claim 11 in which said clock driver includes at least one transistor switch having an output connected alternately between said first and second voltage levels.

13. The clock driving circuitry of claim 12 in which said transistor switch comprises n-p-n transistors.

14. The clock driving circuitry of claim 12 in which said superimposing means includes at least one transistor switch having an output connected alternately between said first and third voltage levels.

15. The clock driving circuitry of claim 14 which includes a timing source connected to control said clock driver and shift said output wave from said first voltage level to said second voltage level once for every line in said frame, to control said superimposing means and shift said output wave from said second voltage level to said third voltage level once per frame, and to control said switching means and discharge said output wave from said third voltage level back to said second voltage level once per frame.

16. The clock driving circuitry of claim 11 which includes a timing source connected to control said clock driver and shift said output wave from said first voltage level to said second voltage level once for every line in said frame, to control said superimposing means and shift said output wave from said second voltage level to said third voltage level once per frame, and to control said switching means and discharge said output wave from said third voltage level back to said second voltage level once per frame.

17. Clock driving circuitry for an interline transfer CCD imager having separate photodiodes and shift registers, said photodiodes forming a frame comprising multiple lines, each of said lines comprising a multiplicity of photodiodes each, and each of said shift registers forming a repository for the charges contained in a corresponding line of photodiodes in said array, said clock driving circuitry comprising:
a clock driver connected to supply an output wave to said imager, said output wave shifting between first and second voltage levels to empty each of said shift registers in succession;
first switching means connected to shift said output wave to a third level to charge all of said photodiodes, said second voltage level being intermediate said first and third voltage levels;
second switching means connected to shift said output wave from said third voltage level back to said second voltage level; and
means to filter out transients from said output wave introduced by said second switching means.

18. The clock driving circuitry of claim 17 which includes at least one emitter follower transistor amplifier connected between said second switching means and said filtering means.

19. The clock driving circuitry of claim 18 in which said clock driver includes at least one transistor switch having an output connected alternately between said first and second voltage levels.

20. The clock driving circuitry of claim 19 in which said transistor switch comprises n-p-n transistors and in which said emitter follower transistor amplifier comprises at least one p-n-p transistor.

21. The clock driving circuitry of claim 19 in which said second switching means includes at least one analog switch having an output connected alternately between aid first and third voltage levels.

22. The clock driving circuitry of claim 21 which includes a timing source connected to control said clock driver and shift said output wave from said first voltage level to said second voltage level once for every line in said frame, to control said first switching means and shift said output wave from said second voltage level to said third voltage level once per frame, and to control said second switching means and shift said output wave from said third voltage level back to said second voltage level once per frame.

23. The clock driving circuitry of claim 18 which includes a timing source connected to control said clock driver and shift said output wave from said first voltage level to said second voltage level once for every line in said frame, to control said first switching means and shift said output wave from said second voltage level to said third voltage level once per frame, and to control said second switching means and shift said output wave from said third voltage level back to said second voltage level once per frame.

* * * * *